(12) United States Patent
Tang et al.

(10) Patent No.: US 8,253,507 B2
(45) Date of Patent: Aug. 28, 2012

(54) FIXED-FREQUENCY CONTROL CIRCUIT AND METHOD FOR PULSE WIDTH MODULATION

(75) Inventors: Chien-Fu Tang, Hsinchu (TW); Isaac Y Chen, Jubei (TW)

(73) Assignee: Richtek Technology Corp., Hsinchu (TW)

( * ) Notice: Subject to any disclaimer, the term of this patent is extended or adjusted under 35 U.S.C. 154(b) by 157 days.

(21) Appl. No.: 12/942,218

(22) Filed: Nov. 9, 2010

(65) Prior Publication Data

US 2011/0109398 A1    May 12, 2011

(30) Foreign Application Priority Data

Nov. 11, 2009   (TW) ................. 98138205 A (51) Int. Cl.
*H03K 7/08*    (2006.01)

(52) U.S. Cl. ........ 332/109; 332/110; 332/111; 375/238; 323/285

(58) Field of Classification Search .......... 332/109–111; 375/238; 323/282, 285, 351
See application file for complete search history.

(56) References Cited

U.S. PATENT DOCUMENTS

| | | | |
|---|---|---|---|
| 6,348,780 B1 * | 2/2002 | Grant | 323/222 |
| 7,132,820 B2 * | 11/2006 | Walters et al. | 323/288 |
| 7,508,180 B2 * | 3/2009 | Chen et al. | 323/282 |
| 2008/0157894 A1 * | 7/2008 | Hariton et al. | 332/109 |

* cited by examiner

*Primary Examiner* — Joseph Chang
*Assistant Examiner* — Jeffrey Shin
(74) *Attorney, Agent, or Firm* — Rosenberg, Klein & Lee (57) ABSTRACT

A fixed-frequency control circuit and method detect the difference between the frequency of a pulse width modulation signal and a target frequency to adjust a current used to determine the on-time or off-time of the pulse width modulation signal, such that the frequency of the pulse width modulation signal is stable at the target frequency.

10 Claims, 8 Drawing Sheets

FIXED-FREQUENCY CONTROL CIRCUIT AND METHOD FOR PULSE WIDTH MODULATION

FIELD OF THE INVENTION

The present invention is related generally to pulse width modulation and, more particularly, to fixed-frequency control for pulse width modulation (PWM).

BACKGROUND OF THE INVENTION

Figure 1:
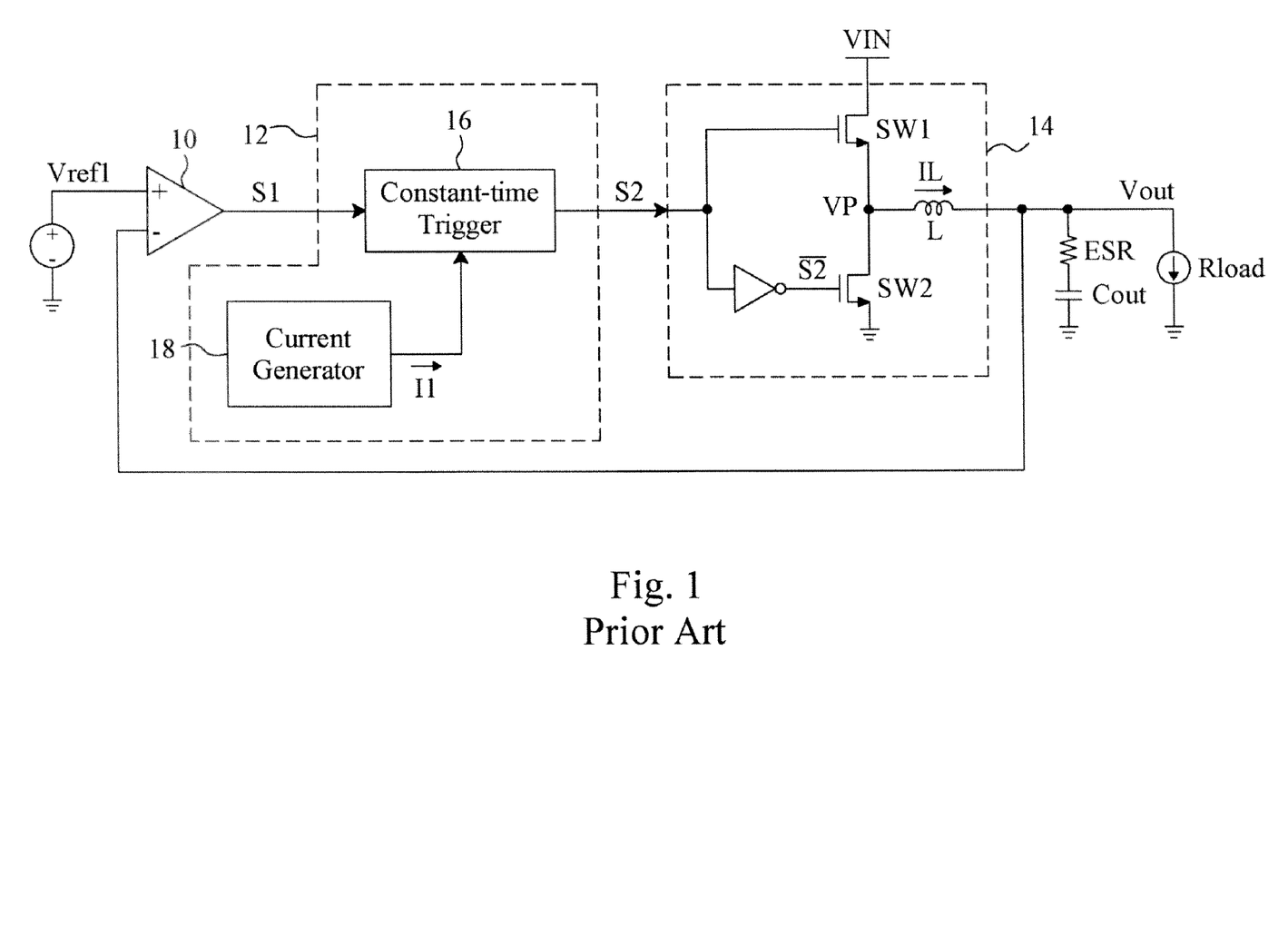
FIG. 1 is a circuit diagram of the basic architecture for constant on-time and constant off-time PWM.
Figure 2:
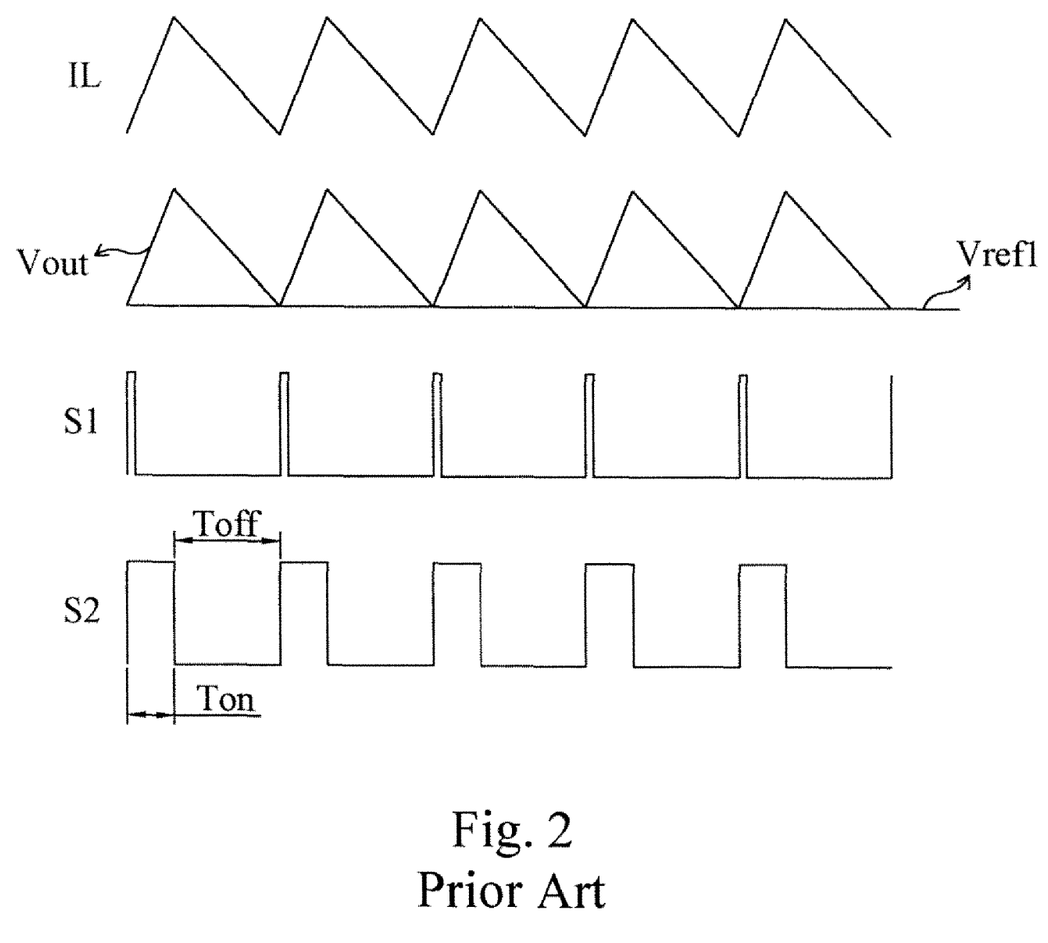
FIG. 2 is a waveform diagram of the circuit shown in FIG. 1.
Figure 3:
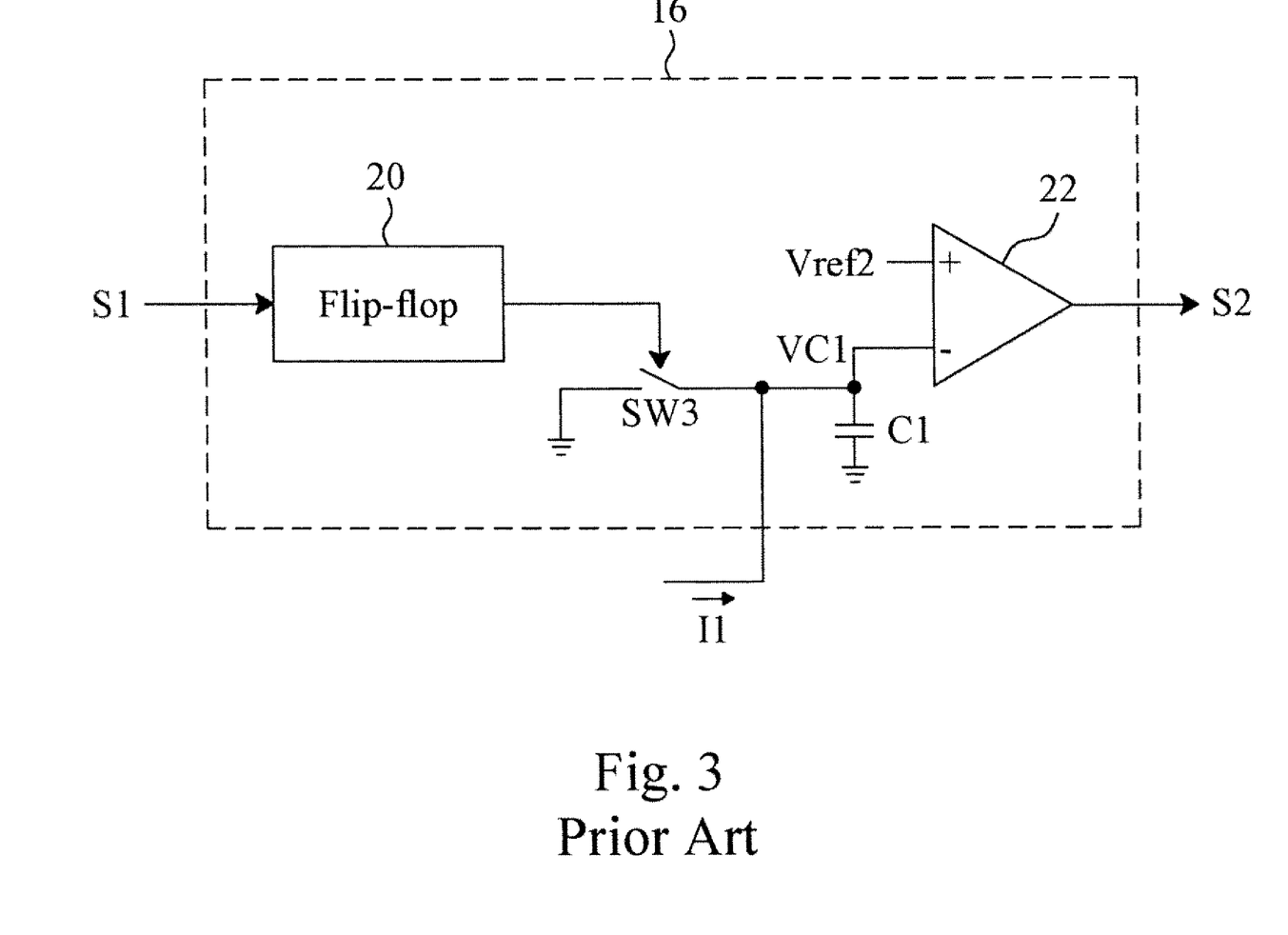
FIG. 3 is a circuit diagram of a constant-time trigger for constant on-time PWM.

If a PWM power converter uses a non-fixed frequency system architecture, such as a constant on-time or constant off-time control system, the frequency of the PWM power converter may deviate from the designed value under different loading and cause new problems. For example, two channels on a printed circuit board (PCB) are designed to operate with a frequency difference of higher than 100 KHz therebetween, but the real operation frequencies of the two channels may quite close to each other under certain loading, thereby causing audio beating. FIG. 1 is a circuit diagram of the basic architecture for constant on-time and constant off-time PWM, and FIG. 2 is a waveform diagram thereof. Referring to FIGS. 1 and 2, a comparator 10 compares the output voltage Vout of the system with a reference voltage Vref1 to generate a comparison signal S1, and a PWM signal generator 12 generates a PWM signal S2 according to the comparison signal S1 to drive a power output stage 14 to convert an input voltage VIN into the output voltage Vout. In the PWM signal generator 12, responsive to the comparison signal S1, a constant-time trigger 16 triggers a constant on-time Ton or a constant off-time Toff, whose width is set by a current I1 provided by a current generator 18. For example, FIG. 3 is a circuit diagram of the constant-time trigger 16 for constant on-time PWM, in which the comparison signal S1 is used to control a switch SW3 and thereby determine the time point at which a capacitor C1 is to be charged, and a comparator 22 compares the capacitor voltage VC1 with a reference voltage Vref2 to generate the PWM signal S2. Once the comparison signal S1 triggers a flip-flop 20 to turn off the switch SW3, the current I1 charges the capacitor C1 and thereby the capacitor voltage VC1 increases from zero at a constant speed. When the capacitor voltage VC1 becomes as high as the reference voltage Vref2, the PWM signal S2 turns off the on-time Ton. As the current I1 is constant, the on-time Ton of the PWM signal S2 has a fixed width. In the system shown in FIG. 1, error under different loading mainly comes from three sources:

(1) The variation of the phase node voltage Vp (=VIN−IL× Ron) with the load current IL, where Ron is the on-resistance of the high side power switch SW1;
(2) The voltage drop (IL×RL) caused by the inductor L and the parasitic resistance RL of the PCB; and
(3) The increased frequency caused by the reduced pulse width of the phase node voltage VP resulted from the shorter deadtime time under heavy loading.

U.S. Pat. No. 6,456,050 uses a timing control circuit to generate a timing signal in response to the duty cycle for constant off-time control; however, a fixed frequency is achievable only when the input/output voltage ratio is less than 0.5. U.S. Pat. No. 6,774,611 uses a phase locked loop (PLL) to control the duty cycle of the PWM signal and thus provide precise frequency control, but the circuit is highly complicated. U.S. Pat. No. 7,508,180 converts the frequency of the PWM signal into a voltage and then compares the voltage with a reference voltage by an error amplifier to produce a differential voltage to adjust the on-time Ton and off-time Toff of the PWM signal and thereby control the frequency of the PWM signal. However, this art does not disclose or teach how to adjust the on-time Ton and off-time Toff of the PWM signal with the differential voltage. Generally, a constant-time trigger controls the width of a constant on-time or constant off-time according to a constant current. Therefore, an additional voltage to current converter will be required to convert the differential voltage into a current, which nevertheless adds to circuit complexity.

Therefore, it is desired a simple fixed-frequency control circuit and method with precise frequency control.

SUMMARY OF THE INVENTION

An object of the present invention is to provide a fixed-frequency control circuit for pulse width modulation.

Another object of the present invention is to provide a fixed-frequency control method for pulse width modulation.

According to the present invention, for pulse width modulation using a constant-time trigger to trigger the on-time or off-time of a PWM signal, and a current generator to provide a first current to determine the width of the on-time or off-time, a fixed-frequency control circuit generates an error current according to the frequency of the PWM signal to be combined into the first current to adjust the width of the on-time or off-time and thereby stabilizes the frequency of the PWM signal at a target frequency.

According to the present invention, for pulse width modulation including triggering the on-time or off-time of a PWM signal and determining the width of the on-time or off-time according to a first current, a fixed-frequency control method generates an error current according to the frequency of the PWM signal to be combined into the first current to adjust the width of the on-time or off-time and thereby stabilizes the frequency of the PWM signal at a target frequency.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 4:
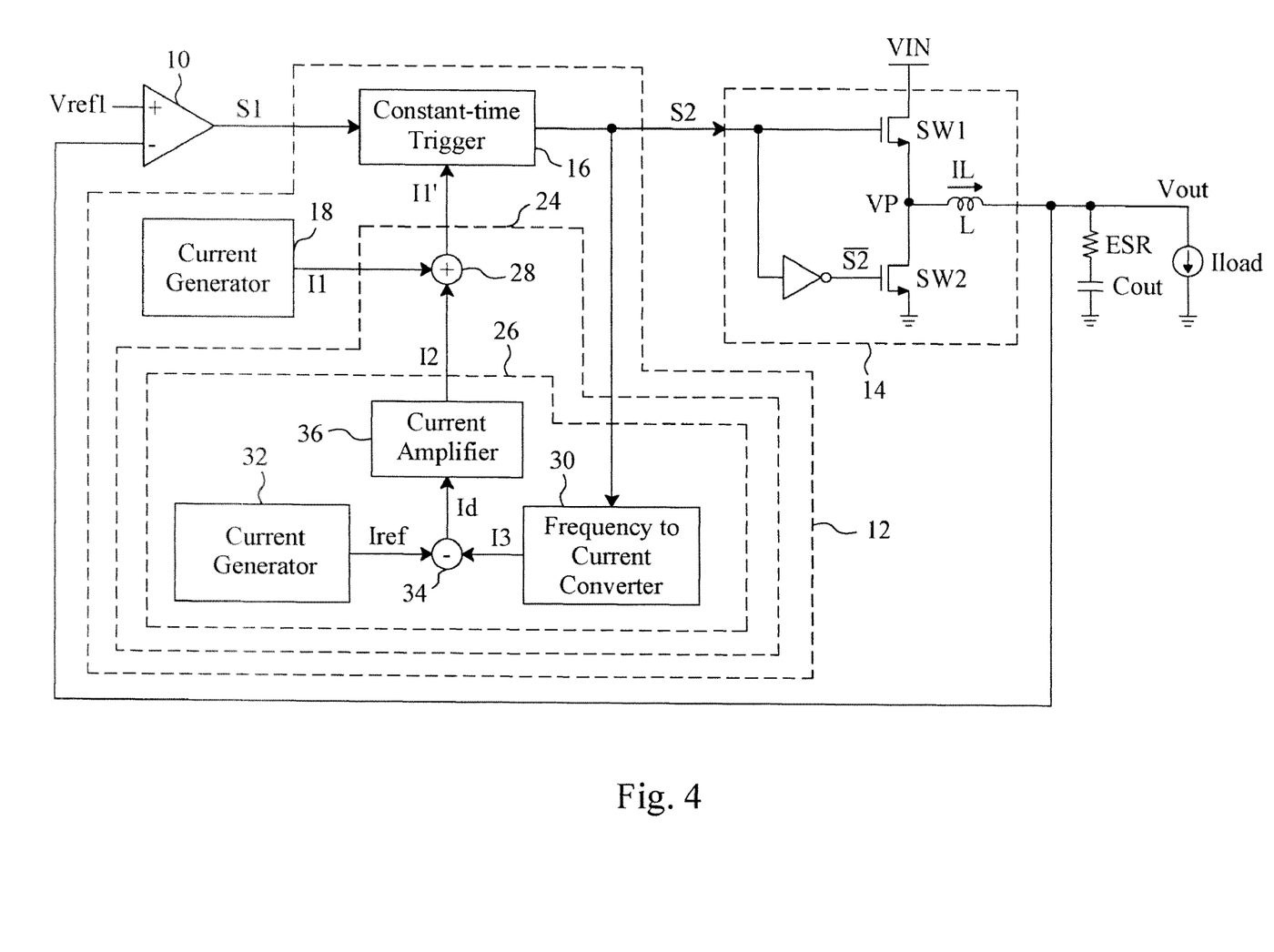
FIG. 4 is a circuit diagram of a first embodiment according to the present invention.

FIG. 4 is a circuit diagram of a first embodiment according to the present invention, in which the PWM signal generator 12 includes a fixed-frequency control circuit 24 in addition to the constant-time trigger 16 and the current generator 18.

Based on the frequency of the PWM signal S2, the fixed-frequency control circuit 24 adjusts the current I1' supplied to the constant-time trigger 16 and thereby controls the frequency of the PWM signal S2. The fixed-frequency control circuit 24 includes an error current generator 26 and an adder 28. The error current generator 26 generates an error current I2 according to the frequency of the PWM signal S2, and the adder 28 adds the error current I2 to the first current I1 to generate the current I1' supplied to the constant-time trigger 16. In the error current generator 26, a frequency to current converter 30 converts the frequency of the PWM signal S2 into a second current I3, a current generator 32 provides a reference current Iref, a subtractor 34 subtracts the second current I3 from the reference current Iref to generate a differential current Id, and a current amplifier 36 amplifies the differential current Id to generate the error current I2. The current amplifier 36 can be implemented by a current mirror. After the first current I1 is adjusted by the error current I2, the constant on-time Ton or constant off-time Toff generated by the constant-time trigger 16 is adjusted, for example as shown in FIG. 3, such that the frequency of the PWM signal S2 is stabilized at a target frequency determined by the reference current Iref. Thus, by adjusting the reference current Iref, the frequency of the PWM signal S2 can be precisely adjusted. Furthermore, as the error current generator 26 generates the error current I2 directly from the frequency of the PWM signal S2, only a simple circuit is needed for the task.

Figure 5:
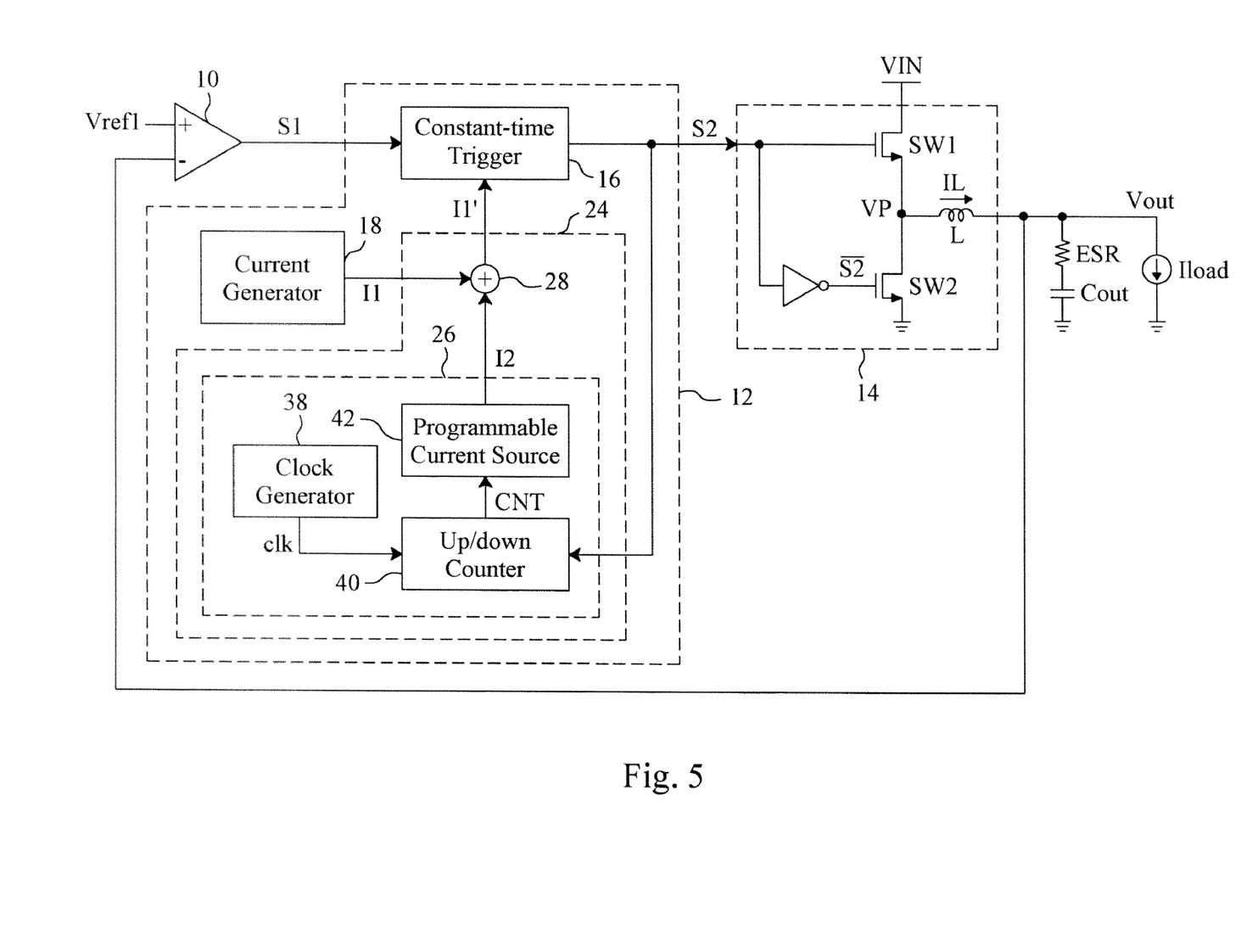
FIG. 5 is a circuit diagram of a second embodiment according to the present invention.

In a second embodiment as shown in FIG. 5, the error current generator 26 is implemented by a digital circuit, in which a clock generator 38 provides a clock signal clk having a fixed frequency, an up/down counter 40 calculates the frequency difference between the PWM signal S2 and the clock signal clk to generate a count CNT, and a programmable current source 42 determines the error current I2 according to the count CNT. The error current generator 26 may either supply the error current I2 to the adder 28 or draw the error current I2 from the adder 28, so as to adjust the current I1' supplied to the constant-time trigger 16 to stabilize the frequency of the PWM signal S2 at the frequency of the clock signal clk. Since the error current generator 26 generates the error current I2 directly from the frequency of the PWM signal S2, the circuit is simpler.

Figure 6:
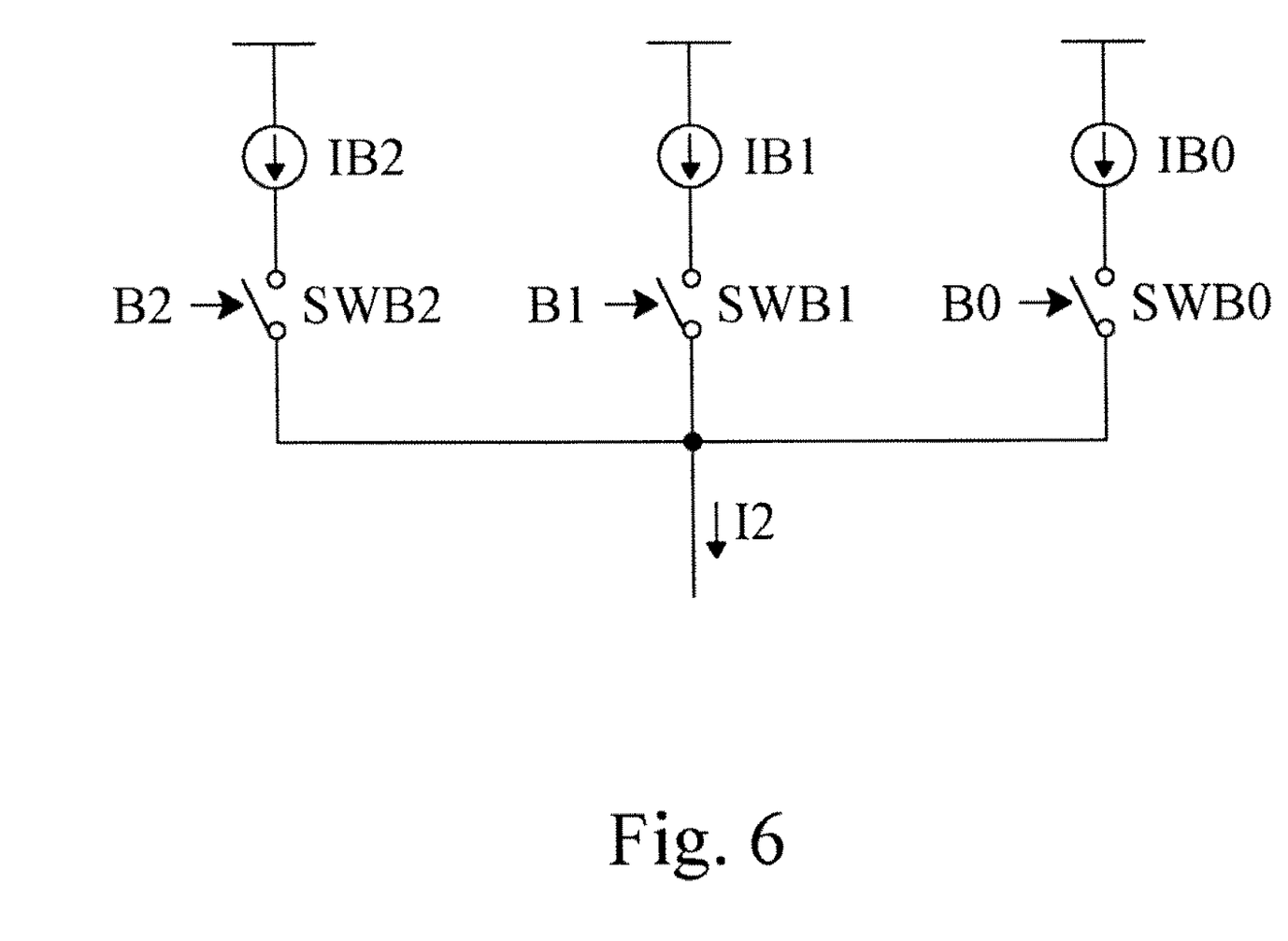
FIG. 6 is a circuit diagram of an embodiment for the programmable current source shown in FIG. 5.

FIG. 6 is a circuit diagram of an embodiment for the programmable current source 42 shown in FIG. 5, which includes parallel-connected current sources IB0, IB1 and IB2 as well as switches SWB0, SWB1 and SWB2 serially connected to the current sources IB0, IB1 and IB2 respectively. The count CNT includes bits B0, B1 and B2 for controlling the switches SWB0, SWB1 and SWB2 respectively. Thus, the count CNT determines the configuration of the switches SWB0, SWB1 and SWB2 and thereby determines the current sources that will output jointly. In consequence, the count CNT determines the error current I2. For example, if the count CNT is "101", the switches SWB0 and SWB2 will be closed, and the switch SWB1 opened; as a result, the error current I2 equals to IB0+IB2. If the count CNT is "110", the switches SWB1 and SWB2 will be closed, and the switch SWB0 opened, thus generating an error current I2 equal to IB1+IB2. The error currents I2 corresponding to other bit combinations of the count CNT can be deduced by analogy.

Figure 7:
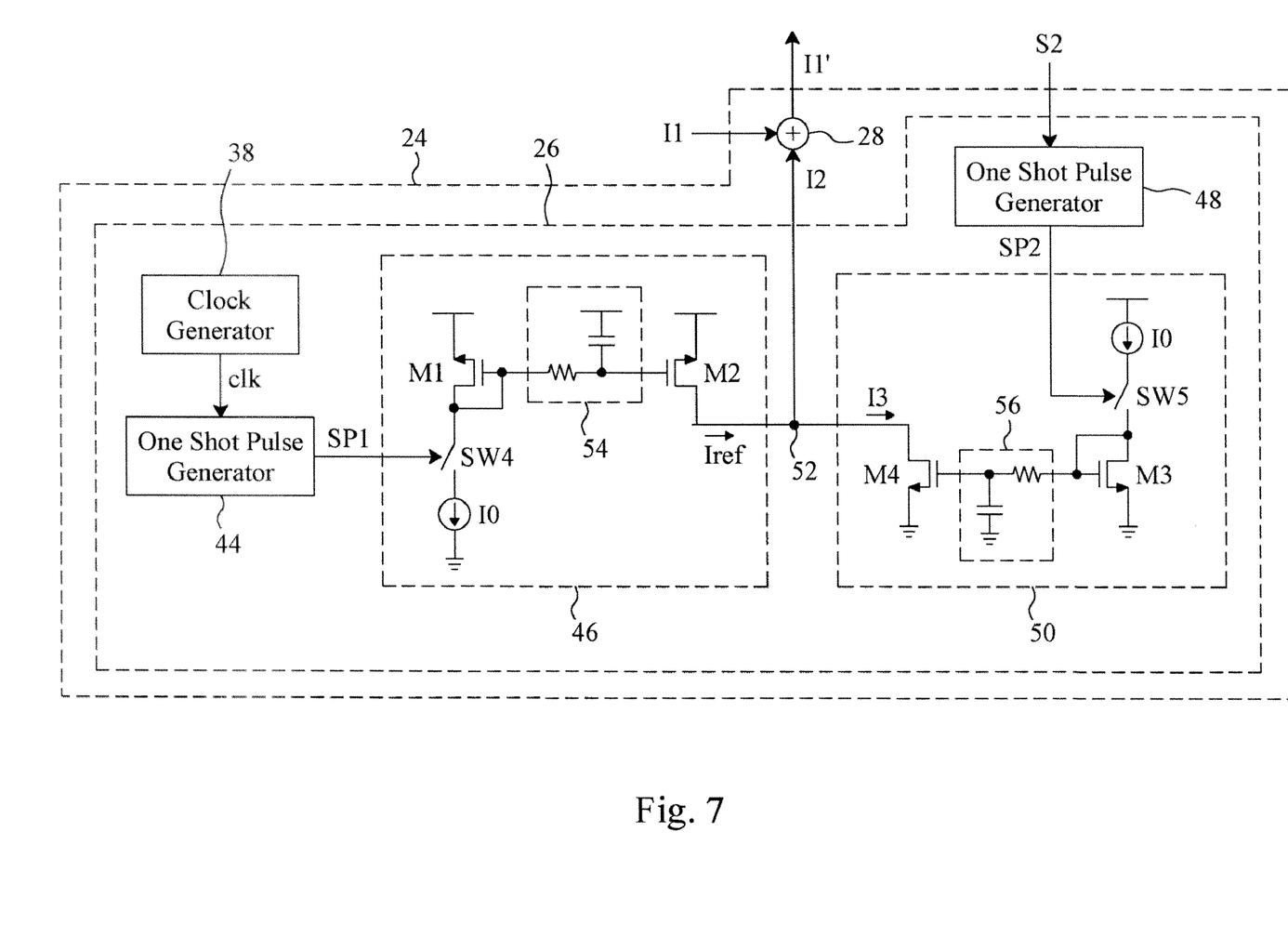
FIG. 7 is a circuit diagram of a third embodiment according to the present invention.

FIG. 7 is a circuit diagram of a third embodiment for the fixed-frequency control circuit 24, in which the error current generator 26 includes a clock generator 38 to provide a clock signal clk having a fixed frequency, a one shot generator 44 triggered by the clock signal clk to generate a pulse signal SP1, a current mirror 46 responsive to the pulse signal SP1 to generate a reference current Iref related to the frequency of the clock signal clk, a one shot generator 48 triggered by the PWM signal S2 to generate a pulse signal SP2, and a current mirror 50 responsive to the pulse signal SP2 to generate a current I3 related to the frequency of the PWM signal S2, and the outputs of the current mirrors 46 and 50 are connected to an input 52 of the adder 28 for the adder 28 to add the differential current I2 between the reference current Iref and the second current I3 to the first current I1 to generate the current I1'. In the current mirror 46, a transistor M1 has a drain and a gate connected to each other and connected to a current source IO via a switch SW4 controlled by the pulse signal SP1, a low-pass filter 54 is coupled between the gate of the transistor M1 and the gate of a transistor M2 having a drain connected to the input 52 of the adder 28, the sources of the transistors M1 and M2 are both connected to a power supply, and the transistor M2 mirrors the current of the transistor M1 to generate the reference current Iref. In the current mirror 50, a transistor M3 has a drain and a gate connected to each other and connected to a current source IO via a switch SW5 controlled by the pulse signal SP2, a low-pass filter 56 is coupled between the gate of the transistor M3 and the gate of a transistor M4 having a drain connected to the input 52 of the adder 28, the sources of the transistors M3 and M4 are both grounded, and the transistor M4 mirrors the current of the transistor M3 to generate the second current I3.

Figure 8:
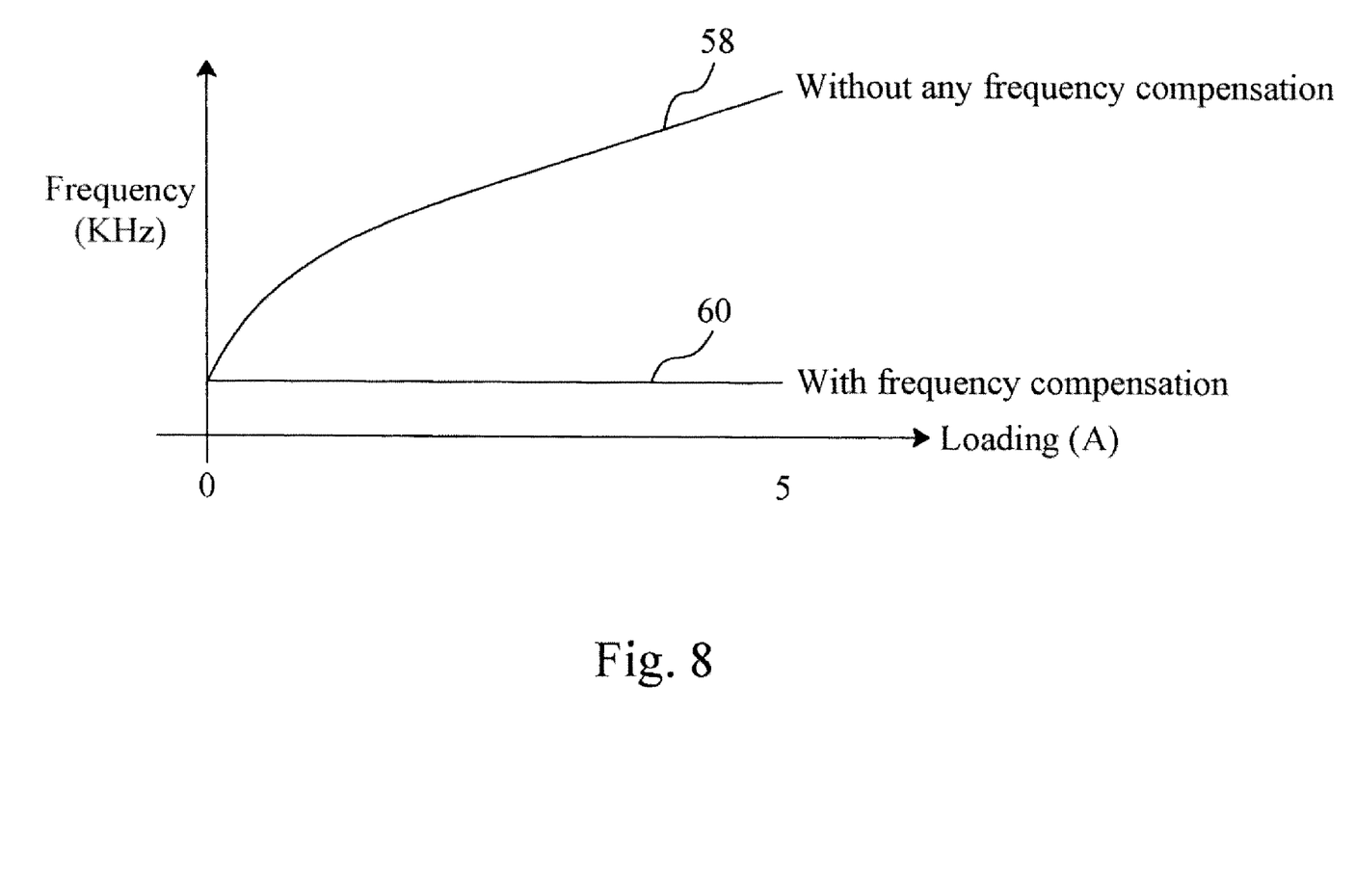
FIG. 8 is a diagram showing the curves of frequency to loading in a PWM system.

FIG. 8 is a diagram showing two curves describing the relationship between the frequency of the PWM signal S2 and the load current IL. As shown by the curve 58, there is a nonlinear relationship between the frequency and load current IL of a conventional constant on-time PWM power converter. However, after adjusted by the fixed-frequency control circuit 26 of the present invention, the frequency of the PWM signal S2 is substantially kept at a constant value, as shown by the curve 60.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A fixed-frequency control circuit for pulse width modulation triggering an on-time or an off-time of a pulse width modulation signal and determining a width of the on-time or the off-time according to a first current, the fixed-frequency control circuit comprising:
    a frequency to current converter operative to convert a frequency of the pulse width modulation signal into a second current;
    a current generator providing a reference current;
    a subtractor connected to the frequency to current converter and the current generator, for subtracting the second current from the reference current to generate a differential current;
    a current amplifier connected to the subtractor for amplifying the differential current to generate an error current; and
    an adder connected to the current amplifier for adding the error current to the first current to adjust the width of the on-time or the off-time to stabilize the frequency of the pulse width modulation signal at a target frequency determined by the reference current.

2. A fixed-frequency control circuit for pulse width modulation triggering an on-time or an off-time of a pulse width modulation signal and determining a width of the on-time or the off-time according to a first current, the fixed-frequency control circuit comprising:

a clock generator providing a clock signal having a fixed-frequency;

an up/down counter connected to the clock generator for calculating a frequency difference between the pulse width modulation signal and the clock signal to generate a count;

a programmable current source connected to the up/down counter, operative to determine an error current according to the count; and an adder connected to the programmable current source for adding the error current to the first current to adjust the width of the on-time or the off-time to stabilize the frequency of the pulse width modulation signal at the frequency of the clock signal.

3. The fixed-frequency control circuit of claim 2, wherein the programmable current source comprises a plurality of common output switch current sources controlled by a plurality of bits in the count respectively.

4. A fixed-frequency control circuit for pulse width modulation triggering an on-time or an off-time of a pulse width modulation signal and determining a width of the on-time or the off-time according to a first current, the fixed-frequency control circuit comprising:

a clock generator providing a clock signal having a fixed-frequency;

a first one shot generator connected to the clock generator, triggered by the clock signal to generate a first pulse signal;

a first current mirror connected to the first one shot generator, responsive to the first pulse signal to generate a reference current related to a frequency of the clock signal;

a second one shot generator triggered by the pulse width modulation signal to generate a second pulse signal;

a second current mirror connected to the second one shot generator, responsive to the second pulse signal to generate a second current related to a frequency of the pulse width modulation signal; and an adder connected to the first and second current mirrors for adding a differential current between the reference current and the second current to the first current to adjust the width of the on-time or the off-time to stabilize the frequency of the PWM signal at the frequency of the clock signal.

5. The fixed-frequency control circuit of claim 4, wherein the first current mirror comprises:

a current source;

a first transistor having a gate and a drain connected to each other;

a switch connected between the current source and the drain of the first transistor, controlled by the first pulse signal;

a second transistor having a drain connected to the adder, for mirroring a current of the first transistor to generate the reference current; and a low-pass filter connected between the gate of the first transistor and a gate of the second transistor.

6. The fixed-frequency control circuit of claim 4, wherein the second current mirror comprises:

a current source;

a first transistor having a gate and a drain connected to each other;

a switch connected between the current source and the drain of the first transistor, controlled by the second pulse signal;

a second transistor having a drain connected to the adder, for mirroring a current of the first transistor to generate the second current; and a low-pass filter connected between the gate of the first transistor and a gate of the second transistor.

7. A fixed-frequency control method for pulse width modulation triggering an on-time or an off-time of a pulse width modulation signal and determining a width of the on-time or the off-time according to a first current, the fixed-frequency control method comprising the steps of:

converting a frequency of the pulse width modulation signal into a second current;

subtracting the second current from a reference current to generate a differential current;

amplifying the differential current to generate an error current; and adding the error current to the first current to adjust the width of the on-time or the off-time to stabilize the frequency of the pulse width modulation signal at a target frequency determined by the reference current.

8. A fixed-frequency control method for pulse width modulation triggering an on-time or an off-time of a pulse width modulation signal and determining a width of the on-time or the off-time according to a first current, the fixed-frequency control method comprising the steps of:

calculating a frequency difference between the pulse width modulation signal and a clock signal to generate a count;

determining an error current according to the count; and adding the error current to the first current to adjust the width of the on-time or the off-time to stabilize the frequency of the pulse width modulation signal at the frequency of the clock signal.

9. The fixed-frequency control method of claim 8, wherein the step of determining an error current according to the count comprises the steps of:

determining a configuration of a plurality of switches according to the count; and common outputting a plurality of current sources according to the configuration to generate the error current.

10. A fixed-frequency control method for pulse width modulation triggering an on-time or an off-time of a pulse width modulation signal and determining a width of the on-time or the off-time according to a first current, the fixed-frequency control method comprising the steps of:

triggering a first pulse signal by a clock signal;

responsive to the first pulse signal, generating a reference current related to a frequency of the clock signal;

triggering a second pulse signal by the pulse width modulation signal;

responsive to the second pulse signal, generating a second current related to a frequency of the pulse width modulation signal; and adding a differential current between the reference current and the second current to the first current to adjust the width of the on-time or the off-time to stabilize the frequency of the pulse width modulation signal at the frequency of the clock signal.

* * * * *